(12) United States Patent
Martisauskas et al.

(10) Patent No.: US 10,161,814 B2
(45) Date of Patent: Dec. 25, 2018

(54) SELF-SEALING SENSOR IN AN ELECTRONIC DEVICE

(71) Applicant: Apple Inc., Cupertino, CA (US)

(72) Inventors: Steven J. Martisauskas, Cupertino, CA (US); Richard D. Shuma, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/159,631

(22) Filed: May 19, 2016

(65) Prior Publication Data

US 2016/0349123 A1 Dec. 1, 2016

Related U.S. Application Data

(60) Provisional application No. 62/166,829, filed on May 27, 2015.

(51) Int. Cl.

| G01L 1/14 | (2006.01) |
|---|---|
| H05K 1/18 | (2006.01) |
| H05K 3/30 | (2006.01) |
| G06F 1/16 | (2006.01) |
| G06F 3/041 | (2006.01) |
| G06F 3/044 | (2006.01) |
| H04M 1/02 | (2006.01) |

(52) U.S. Cl.
CPC ............. *G01L 1/14* (2013.01); *G06F 1/1643* (2013.01); *G06F 3/044* (2013.01); *G06F 3/0414* (2013.01); *H05K 1/18* (2013.01); *H05K 3/30* (2013.01); *G06F 2203/04103* (2013.01); *H04M 1/026* (2013.01); *H05K 2201/05* (2013.01); *H05K 2201/10151* (2013.01)

(58) Field of Classification Search
CPC . G06F 3/0414; G01L 1/16; G01L 1/14; G01L 1/00; H03K 17/975
USPC ..................................................... 73/862.68
See application file for complete search history.

(56) References Cited

U.S. PATENT DOCUMENTS

| 4,675,569 A | 6/1987 | Bowman et al. |
| 4,712,037 A * | 12/1987 | Verbeek ............... B06B 1/0607 |
| | | 310/321 |
| 4,989,457 A | 2/1991 | Berger et al. |
| 5,447,074 A | 9/1995 | Polaert et al. |
| 5,543,589 A | 8/1996 | Buchana et al. |

(Continued)

FOREIGN PATENT DOCUMENTS

| CN | 101046720 | 10/2007 |
| CN | 101071354 | 11/2007 |

(Continued)

OTHER PUBLICATIONS

Bau, et al., "TeslaTouch: Electrovibration for Touch Surfaces," UIST'10, Oct. 3-6, 2010, New York, New York USA, 10 pages.

(Continued)

*Primary Examiner* — Jonathan Dunlap
*Assistant Examiner* — Octavia Hollington
(74) *Attorney, Agent, or Firm* — Brownstein Hyatt Farber Schreck, LLP (57) ABSTRACT

A sensor is disposed between a first component and a second component of an electronic device. The sensor includes a first surface having a first dimension and a second surface having a second dimension that is less than the first dimension such that the sensor has a tapered profile.

36 Claims, 9 Drawing Sheets

(56) References Cited

U.S. PATENT DOCUMENTS

| | | |
|---|---|---|
| 5,553,500 A | 9/1996 | Grahn et al. |
| 5,680,160 A | 10/1997 | LaPointe |
| 5,917,165 A | 6/1999 | Platt et al. |
| 5,942,733 A | 8/1999 | Allen |
| 7,114,402 B2 | 10/2006 | Winkler et al. |
| 7,154,481 B2 | 12/2006 | Cross et al. |
| 7,211,885 B2 | 5/2007 | Nordal et al. |
| 7,511,702 B2 | 3/2009 | Hotelling |
| 7,598,652 B2 | 10/2009 | Kornbluh et al. |
| 7,791,596 B2 | 9/2010 | Errico et al. |
| 8,031,275 B2 | 10/2011 | Lee |
| 8,169,332 B2 | 5/2012 | Son |
| 8,199,122 B2 | 6/2012 | Yamamoto et al. |
| 8,305,241 B2 | 11/2012 | Wang et al. |
| 8,345,013 B2 | 1/2013 | Heubel et al. |
| 8,434,951 B2 * | 5/2013 | Wittenberg ............ G03B 11/00 174/520 |
| 8,446,551 B2 * | 5/2013 | Gu .................. 349/122 |
| 8,542,203 B2 | 9/2013 | Serban et al. |
| 8,547,350 B2 | 10/2013 | Anglin et al. |
| 8,547,623 B2 * | 10/2013 | Parry-Jones ......... G02B 26/005 345/173 |
| 8,564,559 B2 | 10/2013 | Hou |
| 8,627,716 B2 | 1/2014 | Son |
| 8,633,916 B2 | 1/2014 | Bernstein et al. |
| 8,635,919 B2 * | 1/2014 | Suzuki ...................... G01L 1/20 73/862.627 |
| 8,724,038 B2 | 5/2014 | Ganapathi et al. |
| 8,890,853 B2 | 11/2014 | Schuele et al. |
| 8,929,085 B2 | 1/2015 | Franklin et al. |
| 9,001,081 B2 * | 4/2015 | Pope ....................... G06F 3/044 200/600 |
| 9,116,569 B2 | 8/2015 | Stacy et al. |
| 9,134,397 B2 | 9/2015 | Solven et al. |
| 9,195,354 B2 | 11/2015 | Bulea et al. |
| 9,274,654 B2 | 3/2016 | Slobodin et al. |
| 9,395,583 B2 | 7/2016 | Kim et al. |
| 9,454,268 B2 | 9/2016 | Badaye et al. |
| 9,489,100 B2 | 11/2016 | Tsutsumi |
| 9,517,547 B2 | 12/2016 | Kasashima et al. |
| 9,696,223 B2 * | 7/2017 | Lisseman .................. G01L 1/20 |
| 2005/0219222 A1 | 10/2005 | Johnson et al. |
| 2007/0085837 A1 | 4/2007 | Ricks et al. |
| 2008/0231605 A1 | 9/2008 | Yang |
| 2010/0013785 A1 | 1/2010 | Murai et al. |
| 2011/0096013 A1 | 4/2011 | Krumpelman et al. |
| 2011/0193791 A1 * | 8/2011 | Tong ...................... G06F 3/044 345/173 |
| 2012/0038577 A1 | 2/2012 | Brown et al. |
| 2012/0075243 A1 | 3/2012 | Doi et al. |
| 2012/0098788 A1 | 4/2012 | Sekiguchi |
| 2012/0099264 A1 * | 4/2012 | Degner ................ G06F 1/1616 361/679.09 |
| 2013/0018489 A1 | 1/2013 | Grunthaner et al. |
| 2013/0082970 A1 | 4/2013 | Frey |
| 2013/0135250 A1 | 5/2013 | Song |
| 2013/0135256 A1 | 5/2013 | Hong et al. |
| 2013/0229350 A1 | 9/2013 | Shaw et al. |
| 2013/0252521 A1 | 9/2013 | Kasashima et al. |
| 2013/0321321 A1 | 12/2013 | Hiraoka |
| 2014/0043289 A1 | 2/2014 | Stern et al. |
| 2014/0085213 A1 | 3/2014 | Huppi et al. |
| 2015/0068897 A1 | 3/2015 | Neel et al. |
| 2015/0130742 A1 | 5/2015 | Chen et al. |
| 2015/0363023 A1 | 12/2015 | Kawaguchi et al. |

FOREIGN PATENT DOCUMENTS

| | | |
|---|---|---|
| CN | 101436111 | 5/2009 |
| CN | 101739183 | 6/2010 |
| CN | 102112947 | 6/2011 |
| EP | 2071312 | 6/2009 |
| JP | 2010079791 | 4/2010 |
| JP | 2011153826 | 8/2011 |
| WO | WO 14/092758 | 6/2014 |
| WO | WO 14/124173 | 8/2014 |
| WO | WO 15/047374 | 4/2015 |
| WO | WO 15/106183 | 7/2015 |

OTHER PUBLICATIONS

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

International Search Report and Written Opinion dated Oct. 10, 2016, PCT/US2016/033959, 12 pages.

* cited by examiner

SELF-SEALING SENSOR IN AN ELECTRONIC DEVICE

CROSS-REFERENCE TO RELATED APPLICATION(S)

This application claims the benefit under 35 U.S.C. § 119(e) of U.S. Provisional Patent Application No. 62/166,829, filed on May 27, 2015, and entitled "Self-Sealing Sensor In An Electronic Device," which is incorporated by reference as if fully disclosed herein.

FIELD

The described embodiments relate generally to electronic devices. More particularly, the present embodiments relate to a sensor in an electronic device.

BACKGROUND

Electronic devices are assembled from many individual circuits, substrates, and structures. These elements are generally housed within the interior of an enclosure of the electronic device. The enclosure protects the internal components from moisture and contaminants such as dirt, sand, and dust. Moreover, it is desirable that the enclosure provide this protection in a variety of environments and at different atmospheric pressures.

SUMMARY

Embodiments described herein provide a sensor that is disposed between a first component and a second component of an electronic device. The sensor includes a first surface having a first dimension and a second surface having a second dimension that is less than the first dimension such that the sensor has a tapered profile. Example sensors include, but are not limited to, a force sensor, a touch sensor, a temperature sensor, and a light sensor. One or more sensors can be used in any suitable electronic device. For example, an electronic device can be a laptop computer, a digital music player, a gaming device, a camera, a wearable communication device, and an altimeter.

In one aspect, the sensor can include a first tapered interface between a first layer and a second layer. The first and second layers are positioned adjacent to at least two components in the electronic device. In one illustrative embodiment, one component may be an enclosure and the other component a cover glass. A second tapered interface can be formed between the sensor and the cover glass. Additionally or alternatively, a third tapered interface may be formed between the sensor and the enclosure. As one example, a top surface of the sensor may be adjacent the bottom surface of the cover glass and the side and bottom surfaces of the sensor can be adjacent the enclosure.

In another aspect, a sensor may include a first adhesive layer positioned between a first component and a first flexible circuit layer; a second adhesive layer positioned between a second component and a second flexible circuit layer; and a compliant layer positioned between the first and second flexible circuit layers. At least one layer in the sensor is a tapered layer. In one non-limiting example, an adhesive layer, a flexible circuit layer, and/or a compliant layer may be a tapered layer. The tapered layer produces a layer with one end that is thicker than the other end of the layer.

In yet another aspect, an electronic device can include an enclosure having an opening, a cover glass disposed in the opening, and a force sensor positioned between the cover glass and the enclosure. A bottom surface of the cover glass adjacent a top surface of the force sensor is tapered such that a thickness of the cover glass is less at an end of the cover glass.

In another aspect, an electronic device may include an enclosure having an opening and a ledge extending into an interior of the electronic device, a cover glass disposed in the opening, and a force sensor positioned between the cover glass and the ledge. A surface of the ledge adjacent a bottom surface of the force sensor is tapered such that a thickness of the ledge is greater at the end of the ledge in the interior of the electronic device.

In some embodiments, the sensor is a capacitive force sensor that includes a first flexible circuit layer, a second flexible circuit layer spaced apart from the first flexible circuit layer, and a compliant layer positioned between the first and second flexible circuit layers. A first set of conductive plates may be included in the first flexible circuit and a second set of conductive plates can be included in the second flexible circuit. Each conductive plate in the first set of conductive plates is paired with a respective conductive plate in the second set of conductive plates. Collectively, the paired conductive plates form capacitors. The force sensor is configured to detect a force applied to an input surface (e.g., the cover glass) through capacitance measurements, or changes in the capacitance measurements, of one or more capacitors.

In some embodiments, a taper angle of a tapered interface or a tapered layer is a function of the ratio of the surface area of one exposed surface and a surface area of another exposed surface. For example, the taper angle may be a function of a ratio of the surface area of the exposed cover glass and the surface area of the exposed side of the sensor. In some embodiments, the taper angle of the tapered interface is included in a range of one to five degrees.

Additionally or alternatively, the tapered interface may have a length of one hundred and fifty microns or less. For example, a length of the first tapered interface is included in a range of twenty-five to seventy-five microns.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Embodiments described herein provide a sensor that may be positioned between two or more components in an electronic device. The sensor can function as a self-sealing gasket in some embodiments. The sensor can mate the components together as well as provide sensor functionality. In one non-limiting example, a force sensor can be positioned at a junction between an enclosure and a cover glass.

The force sensor can fill the space between the enclosure and the cover glass, and the enclosure and the cover glass can mate to the sensor. In this manner, the force sensor can function as a gasket and seal the junction between the two surfaces of the enclosure and the cover glass.

In some embodiments, the sensor can include a compliant layer positioned between two flexible circuit layers. At least one of the flexible circuit layers can include circuitry or components that support the sensor functionality. A first adhesive layer is disposed between a first component of the electronic device and one of the flexible circuit layers. A second adhesive layer is positioned between the other flexible circuit layer and a second component of the electronic device. Other embodiments are not limited to this construction. A sensor can include one or more layers. Additionally, the circuitry or components that support the sensor functionality may be included in one or more layers in the sensor.

Additionally, the first component is described herein as an enclosure and the second component as a cover glass. Other embodiments, however, can position the sensor between two or more different types of components, and/or two or more different parts of a component. As one example, an enclosure may include a top part and a side or underlying internal part.

A surface of one or more layers in the sensor and/or in a surface of at least one of the components that mate to the sensor is tapered. The tapered surface or surfaces each produce a tapered interface. In some instances, the tapered interface(s) associated with the sensor may counter a shearing force, allowing the electronic device to withstand higher pressures. When exposed to an external pressure, the force sensor can experience a compressive force as well as a shearing (side) force. The tapered design allows the shearing force to be countered by an opposite but substantially equal horizontal component of the compressive force. Thus, in addition to providing the sensor functionality, in some situations the sensor may operate as a self-sealing gasket that can be substantially independent of the pressure applied to an electronic device.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with layers of a display or an electronic device, the directional terminology is intended to be construed broadly, and therefore should not be interpreted to preclude the presence of one or more intervening layers or other intervening features or elements. Thus, a given layer that is described as being formed, positioned, disposed on or over another layer, or that is described as being formed, positioned, disposed below or under another layer may be separated from the latter layer by one or more additional layers or elements.

Figure 1:
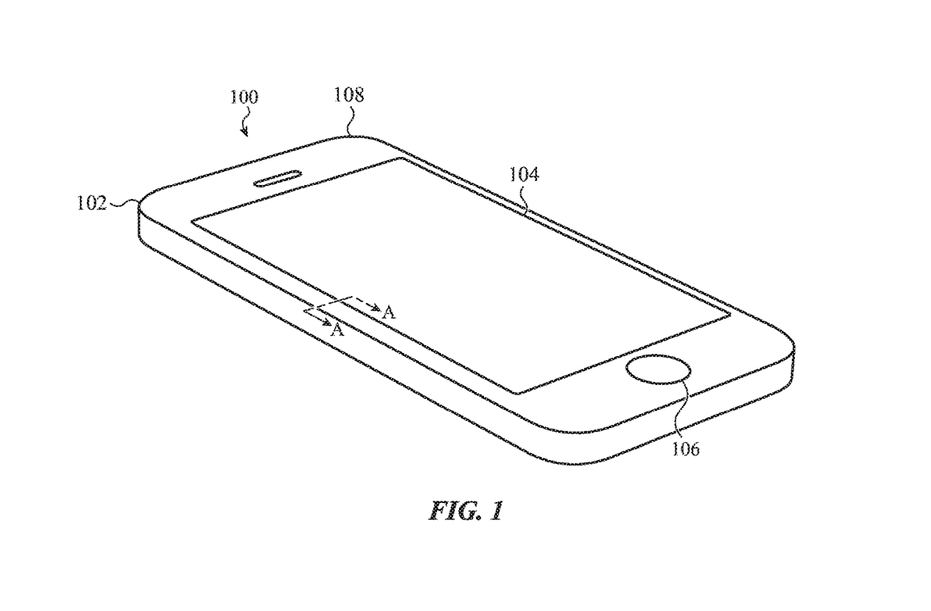
FIGS. 1 and 2 are perspective views of example electronic devices that can be configured to include a self-sealing sensor.
Figure 2:
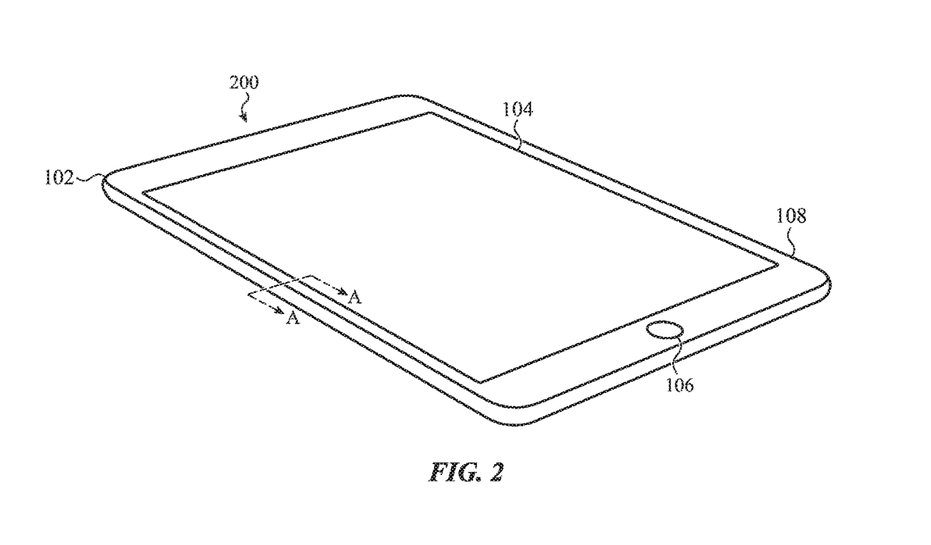

Referring now to FIGS. 1 and 2, there are shown perspective views of example electronic devices that can be configured to include a self-sealing sensor. The electronic device 100 is depicted as a smart telephone, while the electronic device 200 is a tablet computing device. Other embodiments are not limited to these types of electronic devices. One or more self-sealing sensors can be used in any suitable electronic device. For example, an electronic device can be a laptop computer, a digital music player, a gaming device, a health monitoring device, a stopwatch, a wearable communication device, a camera, and any other suitable electronic device.

The example electronic devices 100, 200 can each include internal components such as a processing device coupled with or operably connected to a memory, one or more sensors, one or more communication interfaces, output devices such as displays and speakers, one or more input devices, a power supply (e.g., a battery), and a health monitoring system. The communication interface(s) can provide electronic communications between the communications device and any external communication network, device or platform, such as but not limited to wireless interfaces, Bluetooth interfaces, USB interfaces, Wi-Fi interfaces, TCP/IP interfaces, network communications interfaces, or any conventional communication interfaces.

The sensor(s) may be configured to sense substantially any type of characteristic, such as but not limited to, images, pressure, light, touch, force, temperature, position, motion, and so on. For example, the sensor(s) may be an image sensor, a temperature sensor, a light or optical sensor, an atmospheric pressure sensor, a proximity sensor, a force sensor, a humidity sensor, a magnet, a gyroscope, an accelerometer, and so on.

The health monitoring system can be configured to detect, measure, or determine any suitable health parameter of a user. For example, a health monitoring system may detect a heart rate or pulse of the user, the blood pressure, and/or an amount of calories expended based on an activity. The health monitoring system, in conjunction with a communication interface, may transmit or receive health, fitness, and/or wellness data or information to or from a website or another electronic device, such as a smart telephone or tablet computing device.

An enclosure 102 can form an outer surface or partial outer surface for the internal components of the electronic devices 100, 200. The enclosure 102 at least partially surrounds a display 104 and one or more input/output devices 106 (shown as a button). The enclosure 102 can be formed of one or more components operably connected together, such as a front piece and a back piece. Alternatively, the enclosure 102 can be formed of a single piece operably connected to the display 104. The enclosure 102 can be formed of any suitable material, including, but not limited to, plastic and metal. In the illustrated embodiment, the enclosure 102 is formed into a substantially rectangular shape, although this configuration is not required.

In some embodiments, the display 104 may incorporate an input device configured to receive touch input, force input, temperature input, and the like. The display 104 can be implemented with any suitable display, including, but not limited to, a multi-touch sensing touchscreen device that uses liquid crystal display (LCD) technology, light emitting diode (LED) technology, organic light-emitting display (OLED) technology, or organic electro luminescence (OEL) technology. The display 104 can be located substantially anywhere on the electronic device 100.

In some embodiments, the input/output device 106 can take the form of an input button, which may be a mechanical button, a soft button (e.g., a button that does not physically move but still accepts inputs), an icon or image on a display, and so on. Further, in some embodiments, the button 106 can be integrated as part of a cover glass of the electronic device. Although not shown in FIGS. 1 and 2, the electronic device 100 can include other types of input/output devices, such as a microphone, a speaker, a camera, and one or more ports, such as a network communication port and/or a power cord port.

In some embodiments, a cover glass 108 can be disposed over a top surface of the display 104 or the electronic device 100. The cover glass can be a transparent cover glass when the cover glass is disposed over the display (or the portion of the cover glass overlying the display may be transparent). The cover glass 108 may be made of any suitable material or materials, such as glass, plastic, or sapphire.

Figure 3:
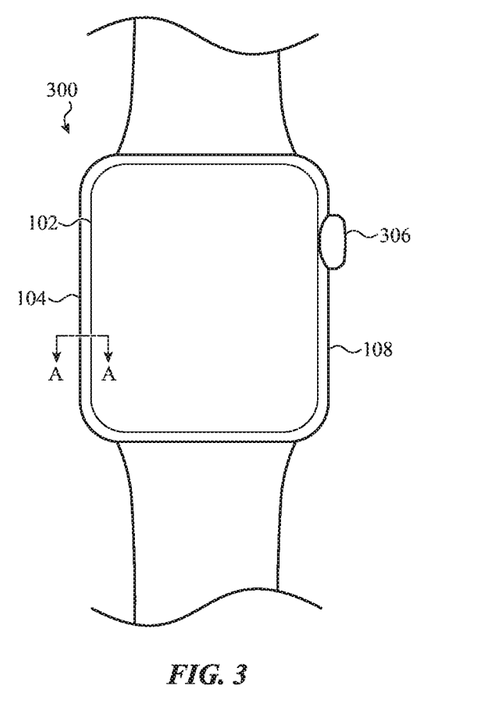
FIG. 3 is a plan view of another example electronic device that may be configured to include a self-sealing sensor.

FIG. 3 is a plan view of another example electronic device that may be configured to include a self-sealing sensor. The illustrated electronic device 300 is a wearable communication device. The wearable communication device may provide information regarding time, health, fitness, wellness, statuses of externally connected or communicating devices and/or software executing on such devices, messages, video, operating commands, and so forth (and may receive any of the foregoing from an external device). Like the electronic devices shown in FIGS. 1 and 2, the electronic device 300 includes internal components such as a processing device coupled with or operably connected to a memory, one or more sensors, one or more communication interfaces, output devices such as displays and speakers, one or more input devices, and a health monitoring system.

The enclosure 102 can form an outer surface or partial outer surface for the internal components of the electronic device 300. The enclosure 102 may at least partially surround the display 104. A transparent cover glass 108 may be disposed over the top surface of the electronic device 300.

The electronic device 300 can also include one or more input devices, such as the crown 306. The crown 306 is configured to rotate about an axis, and a user can rotate the crown to provide various inputs to the electronic device. For example, if the display 104 of the electronic device 300 is displaying a time keeping application, the crown 306 may be rotated in either direction to change or adjust the position of the hands or the digits that are displayed for the time keeping application. As another example, the crown 306 may be rotated to move a cursor or other type of selection mechanism from a first displayed location to a second displayed location in order to select an icon or move the selection mechanism between various icons that are presented on the display 104. In some examples, the crown 306 may be positioned off-center with respect to the enclosure 102, although this configuration is not required.

Although FIGS. 1-3 depict the electronic device 100, 200, and 300 as a smart telephone, a tablet computing device, and a wearable communication device, respectively, other embodiments are not limited to these configurations. A self-sealing sensor can be used in any suitable electronic device. As described earlier, an electronic device can be any suitable electronic device, such as head phones, a digital music player, a gaming device, a camera, and a stopwatch.

Figure 4:
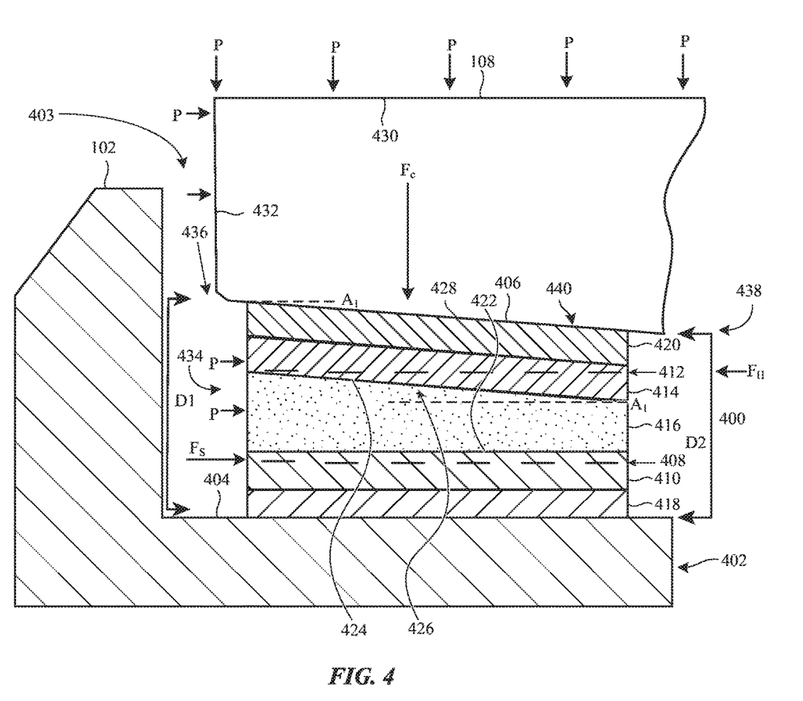
FIGS. 4-9 are cross-sectional views of the electronic devices 100, 200, and 300 taken along line A-A in FIGS. 1-3.

Referring now to FIG. 4, there is shown a cross-sectional view of the electronic devices 100, 200, and 300 taken along line A-A in FIGS. 1-3. A first example of a self-sealing sensor 400 is positioned between the enclosure 102 and the cover glass 108. In particular, the self-sealing sensor 400 rests on a ledge 402 of the enclosure 102. The ledge 402 extends into the interior of the electronic device. The ledge 402 can extend only partially into the interior of the electronic device or the ledge 402 may extend across the interior of the electronic device (e.g., from one side to the other or completely across and below the cover glass). Additionally or alternatively, the sensor 400 can be a continuous sensor that extends completely around the perimeter of the electronic device, or the sensor may be a discrete sensor or sensors that is/are disposed at select locations around the perimeter of the electronic device and/or within the electronic device.

In the illustrated embodiment, the enclosure includes an opening 403 that corresponds to the shape of the cover glass 108. The cover glass 108 is at least partially disposed in the opening 403. The sensor 400 seals the space or the junction between the top surface 404 of the ledge 402 and the bottom surface 406 of the cover glass 108. In some embodiments, the ledge 402 can be integrally formed as part of the enclosure 102. Alternatively, in other embodiments, the ledge 402 is connected or affixed to the enclosure 102 using any suitable attachment mechanism. For example, the ledge 402 can be affixed to the enclosure 102 using an adhesive, one or more mechanical attachments such as a screw, or by welding the ledge 402 to the enclosure 102.

The sensor 400 can include any suitable circuitry or components that support the operations and functionality of the sensor. In a non-limiting example, a first set of conductive plates 408 can be included in a first flexible circuit layer 410 and a second set of conductive plates 412 may be included in a second flexible circuit layer 414. A compliant layer 416 is disposed between the first and second flexible circuit layers 410, 414. Each conductive plate in the first set of conductive plates 408 is paired (e.g., aligned in at least one direction) with a respective conductive plate in the second set of conductive plates 412. Collectively, the paired conductive plates form capacitors. The force sensor 400 is configured to detect a force applied to the cover glass 108 through capacitance measurements, or changes in the capacitance measurements, of one or more capacitors in the force sensor 400. A user can apply the force to the cover glass 108 with a device, such as a stylus, or with a body part (e.g., one or more fingers).

In other embodiments, the force sensor (as well as any other suitable sensor) can be constructed with different circuitry and/or components.

A first adhesive layer 418 is positioned between the first flexible circuit layer 410 and the ledge 402. The first adhesive layer 418 attaches the sensor 400 to the top surface 404 of the ledge 402. A second adhesive layer 420 is positioned between the second flexible circuit layer 414 and the cover glass 108. The second adhesive layer 420 attaches the sensor 400 to the bottom surface 406 of the cover glass 108. Any suitable adhesive material can be used in the adhesive layers 418, 420. In one embodiment, the first and second adhesive layers 418, 420 are pressure sensitive adhesive layers.

Additionally, any suitable compliant layer 416 can be used. As one example, the compliant layer 416 is made of a polymer material, such as silicone, but other embodiments are not limited to this configuration. The compliant layer 416 is configured to provide elastic deformation to the sensor 400 based on a touch and/or a force applied to the cover glass 108. Additionally, in the illustrated embodiment the compliant layer 416 is a dielectric for the capacitors that are formed by the first and second conductive plates 408, 412.

As shown, the compliant layer 416 is a tapered layer and the cover glass 108 is a tapered cover glass. In particular, the bottom surface 422 of the compliant layer 416 is substantially planar or horizontal and a top surface 424 of the compliant layer 416 is tapered. In other words, the compliant layer 416 itself is tapered and the interface 426 between the compliant layer 416 and the second flexible circuit layer 414 is a first tapered interface. As used herein, the terms "taper" and "tapered" refer to a reduction in thickness toward one region (e.g., an end) of at least one layer forming an interface between two layers in the sensor, a reduction in thickness toward one region (e.g., an end) of a first component (e.g., the ledge 402) compared to another region of the first component (e.g., the center or the other end), or a reduction in thickness toward one region of a second component (e.g., the cover glass 108) compared to another region of the second component.

Because the top surface 424 is tapered, the second flexible circuit layer 414 and the second adhesive layer 420 are positioned at an angle in the illustrated embodiment. The angle substantially matches the taper angle $A_1$ of the top surface 424 of the compliant layer 416.

A second tapered interface 428 is formed between the tapered bottom surface 406 of the cover glass 108 and the second adhesive layer 420. Because the bottom surface 406 of the cover glass 108 is adjacent the second adhesive layer 420, the bottom surface 406 is tapered at an angle that substantially matches the taper angle $A_1$.

In some situations, pressure is applied to the exterior of the electronic device (shown in FIG. 4 with the arrows labeled "P"). One such situation is when the electronic device is in or under a liquid, such as water. For example, the pressure can come from the water seeking ingress to an interior of the electronic device. The pressure is across the exposed top surface 430 of the cover glass 108. The force is also applied along the exposed side 432 of the cover glass 108 located in the opening 403 and the exposed side 434 of the sensor 400 located in the gap 436. As described earlier, the tapered interface(s) associated with the sensor may counter a shearing force, allowing the electronic device to withstand greater pressures. When exposed to the external pressure P, the sensor can experience a compressive force (arrow labeled $F_C$) as well as a shearing (side) force (arrow labeled $F_S$). The tapered design of the sensor allows the shearing force $F_S$ to be countered by an opposite but substantially equal horizontal component of the compressive force (arrow labeled $F_H$). Thus, the sensor can operate as a self-sealing gasket that balances the external pressure (e.g., the shearing force $F_S$) with an internal pressure (e.g., the horizontal component $F_H$). The sensor effectively doubles as a seal that can protect the electronic device from a liquid (e.g., water) that is producing an external pressure on the electronic device and is seeking ingress into the interior of the electronic device.

The self-sealing sensor can allow the electronic device to experience a greater amount of pressure. In one non-limiting example, a wearable communication device (such as a watch) may withstand up to five bars of pressure. The tapered profile of the self-sealing sensor can increase the sealing strength of the sensor. For example, the first adhesive layer 418 and/or the second adhesive layer 420 can experience a greater amount of pressure and changes in pressure. The first adhesive layer 418 and/or the second adhesive layer 420 can resist shearing based at least in part on the tapered profile of the sensor.

In the illustrated embodiment, the angle of the taper $A_1$ is a function of a ratio of the surface area of the exposed cover glass 108 and the surface area of the exposed side 434 of the sensor 400. As one example, the taper angle $A_1$ may be three degrees. Alternatively, the taper angle $A_1$ can range from two to four degrees. Additionally, the length of the tapered interface can range from fifty to one hundred and fifty microns in some embodiments. The taper angle and/or the length of a tapered interface may differ in other embodiments.

As shown in FIG. 4, the sensor 400 includes a first surface that has a first dimension D1. A second surface has a second dimension D2 that is less than D1. The sensor 400 has a tapered profile that is based on the different dimensions D1 and D2. The different dimensions D1 and D2 produce a tapered top surface 440 of the sensor 400. In the illustrated embodiment, the first surface is the side surface 434 and the second surface is the side surface 438.

Figure 5:
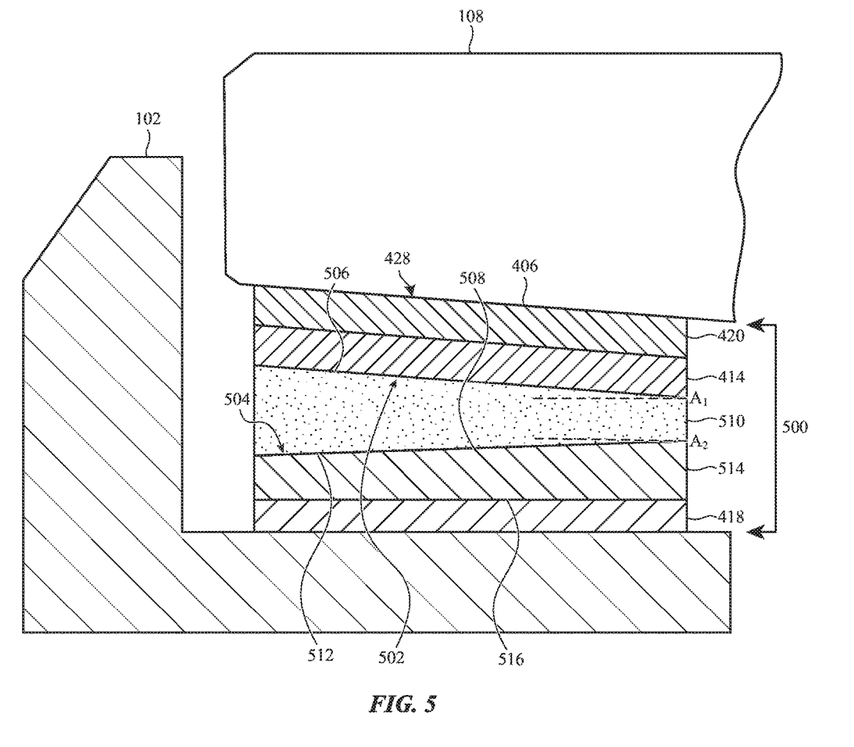

FIG. 5 is another cross-sectional view of the electronic devices 100, 200, and 300 taken along line A-A in FIGS. 1-3. It should be noted that in the embodiments shown in FIGS. 5-8, the first and second sets of conductive plates 408, 412 in the sensor are not shown for clarity. A second self-sealing sensor 500 is positioned between the enclosure 102 and the cover glass 108. The sensor 500 is similar to the sensor 400 shown in FIG. 4, except that the sensor has three tapered interfaces 428, 502, 504. The compliant layer 510 and the first flexible layer 514 are tapered layers and the cover glass 108 is a tapered cover glass. In particular, the top surface 506 and the bottom surface 508 of the compliant layer 510 are tapered. Because the top surface 506 is tapered at a taper angle $A_1$, the second flexible circuit layer 414 and the second adhesive layer 420 are positioned at an angle that substantially matches the taper angle $A_1$. The bottom surface 406 of the cover glass 108 is also tapered at an angle that substantially matches the taper angle $A_1$.

The top surface 512 of the first flexible circuit layer 514 and the bottom surface 508 of the compliant layer 510 are tapered at a taper angle $A_2$. The bottom surface 516 of the first flexible circuit layer 514 and the first adhesive layer 418 are substantially flat or planar. In some embodiments, the taper angles $A_1$ and $A_2$ may be the same. In other embodiments, the taper angles $A_1$ and $A_2$ can differ.

Figure 6:
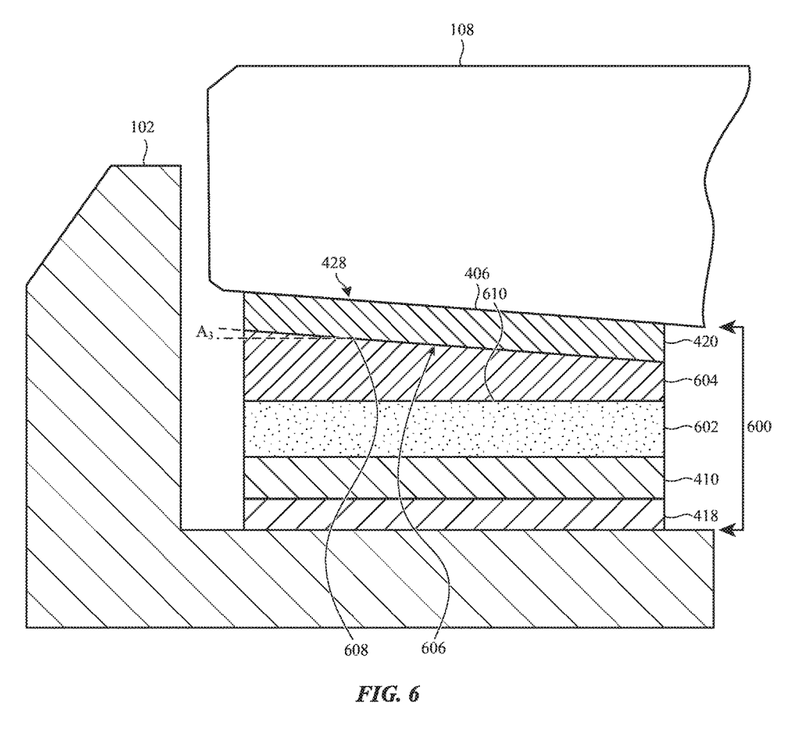

Referring now to FIG. 6, there is shown another cross-sectional view of the electronic devices 100, 200, and 300 taken along line A-A in FIGS. 1-3. A third self-sealing sensor 600 is positioned between the enclosure 102 and the cover glass 108. The sensor 600 includes the first adhesive layer 418, the first flexible circuit layer 410, a compliant layer 602, a second flexible circuit layer 604, and the second adhesive layer 420. In the illustrated embodiment, the second flexible circuit layer 604 is a tapered layer and the cover glass 108 is a tapered cover glass. A tapered interface 606 is formed between the second flexible circuit layer 604 and the second adhesive layer 420. The top surface 608 of the second flexible circuit layer 604 is tapered at a taper angle $A_3$. The bottom surface 610 of the second flexible circuit layer 604 adjacent to the compliant layer 602 is substantially flat.

Because the top surface 608 of the second flexible circuit layer 604 is tapered, the second adhesive layer 420 is positioned at an angle that substantially matches the taper angle $A_3$ in the illustrated embodiment. Similarly, the bottom surface 406 of the cover glass 108 is tapered at an angle that substantially matches the taper angle $A_3$. As described earlier, the tapered interfaces 428 and 606 increase the sealing strength of the sensor 600.

Figure 7:
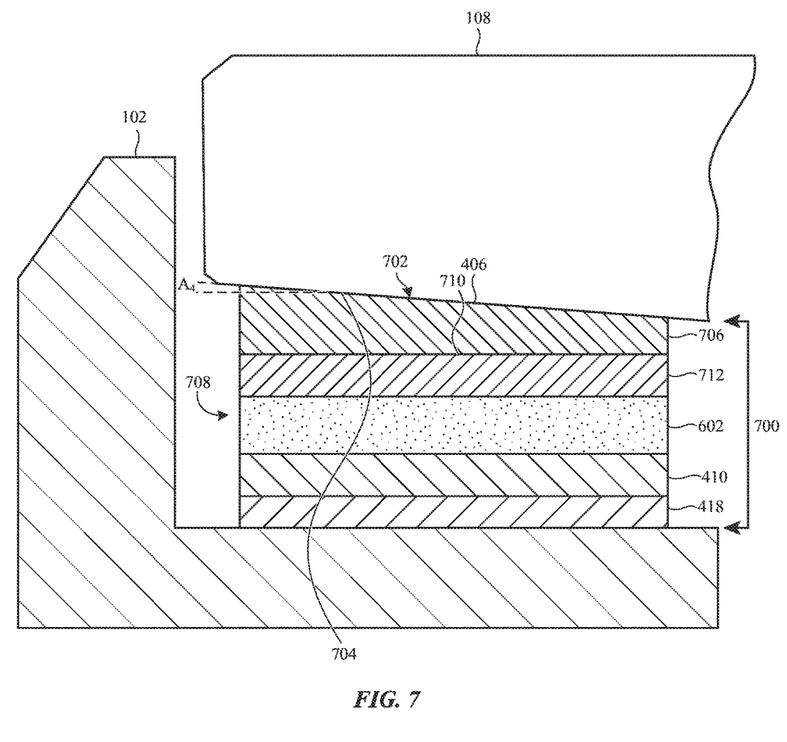

FIG. 7 is another cross-sectional view of the electronic devices 100, 200, and 300 taken along line A-A in FIGS. 1-3. A fourth self-sealing sensor 700 is positioned between the enclosure 102 and the cover glass 108. In this embodiment, the second adhesive layer 706 is a tapered layer and the cover glass 108 is a tapered cover glass. A tapered interface 702 is formed between the tapered top surface 704 of the second adhesive layer 706 and the tapered bottom surface 406 of the cover glass 108. The top surface 704 is tapered at an angle $A_4$. The bottom surface 406 of the cover glass 108 is also tapered at an angle that substantially matches the taper angle $A_4$. As described earlier, in some embodiments the taper angle $A_4$ is a function of the ratio of the surface area of the exposed cover glass 108 and the surface area of the exposed side 708 of the sensor 700.

The bottom surface 710 of the second adhesive layer 706 is substantially flat. The second flexible circuit layer 712, the compliant layer 602, the first flexible circuit layer 410, and the first adhesive layer 418 are all substantially horizontal or planar layers.

Figure 8:
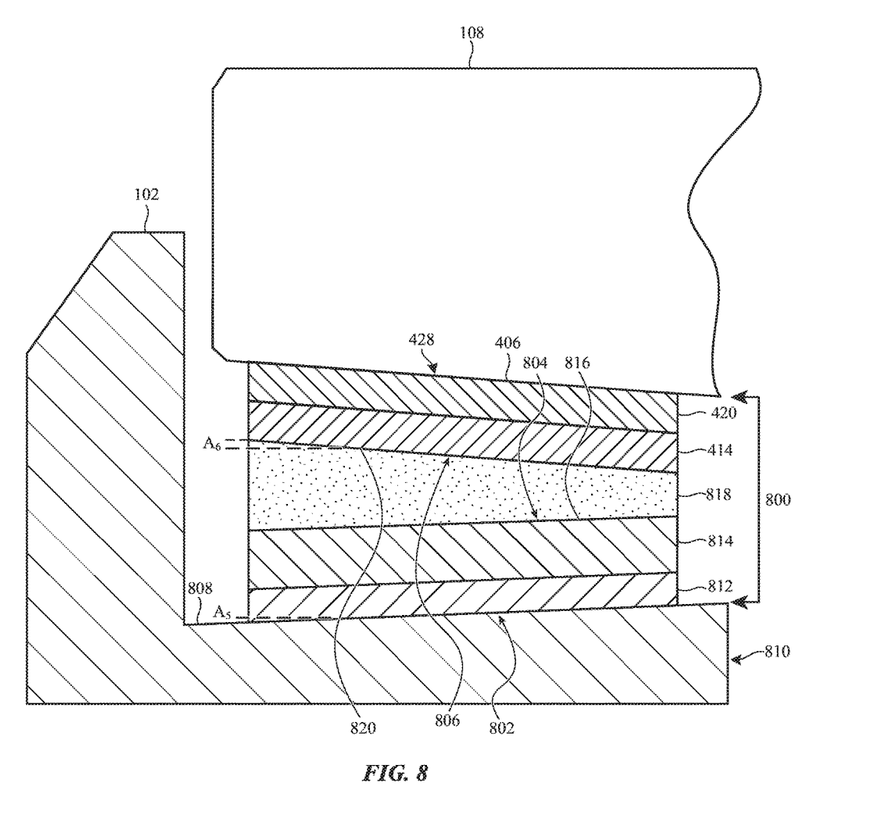

Referring now to FIG. 8, there is shown another cross-sectional view of the electronic devices 100, 200, and 300 taken along line A-A in FIGS. 1-3. A fifth self-sealing sensor 800 is positioned between the enclosure 102 and the cover glass 108. As shown, the ledge 810 is a tapered ledge, the compliant layer 818 is a tapered layer, and the cover glass 108 is a tapered cover glass. The sensor 800 includes four tapered interfaces 802, 804, 806, and 428. The first tapered interface 802 is formed between a tapered top surface 808 of the ledge 810 and the first adhesive layer 812. The top surface 808 is tapered at a taper angle $A_5$. Because the first adhesive layer 812 is disposed over the tapered top surface 808 of the ledge 810, the first adhesive layer 812 is positioned at an angle that substantially matches the taper angle $A_5$. Similarly, the first flexible circuit layer 814 is positioned at the taper angle $A_5$ because the first flexible circuit layer 814 is disposed over the first adhesive layer 812.

The second tapered interface 804 is formed between the tapered bottom surface 816 of the compliant layer 818 and the first flexible circuit layer 814. Because the bottom surface 816 is adjacent the first flexible circuit layer 814, the bottom surface 816 is tapered at an angle that substantially matches the taper angle $A_5$.

The third tapered interface 806 is formed between the tapered top surface 820 of the compliant layer 818 and the second flexible circuit layer 414. The tapered top surface 820 is tapered at an angle $A_6$. Because the second flexible circuit layer 414 is disposed over the tapered top surface 820, the second flexible circuit layer 414 is positioned at the taper angle $A_6$. Similarly, the second adhesive layer 420 is positioned at the taper angle $A_6$ because the second adhesive layer 420 is disposed over the second flexible circuit layer 414. In some embodiments, the taper angles $A_5$ and $A_6$ may be the same. In other embodiments, the taper angles $A_5$ and $A_6$ can differ.

The fourth tapered interface 428 is formed between the tapered bottom surface 406 of the cover glass 108 and the second adhesive layer 420. Because the bottom surface 406 of the cover glass 108 is adjacent the second adhesive layer 420, the bottom surface 406 is tapered at the taper angle $A_6$. As described earlier, the tapered interfaces 428, 802, 804, and 806 increase the sealing strength of the sensor 800. The electronic device can experience a greater amount of pressure based at least in part on the self-sealing sensor 800.

Figure 9:
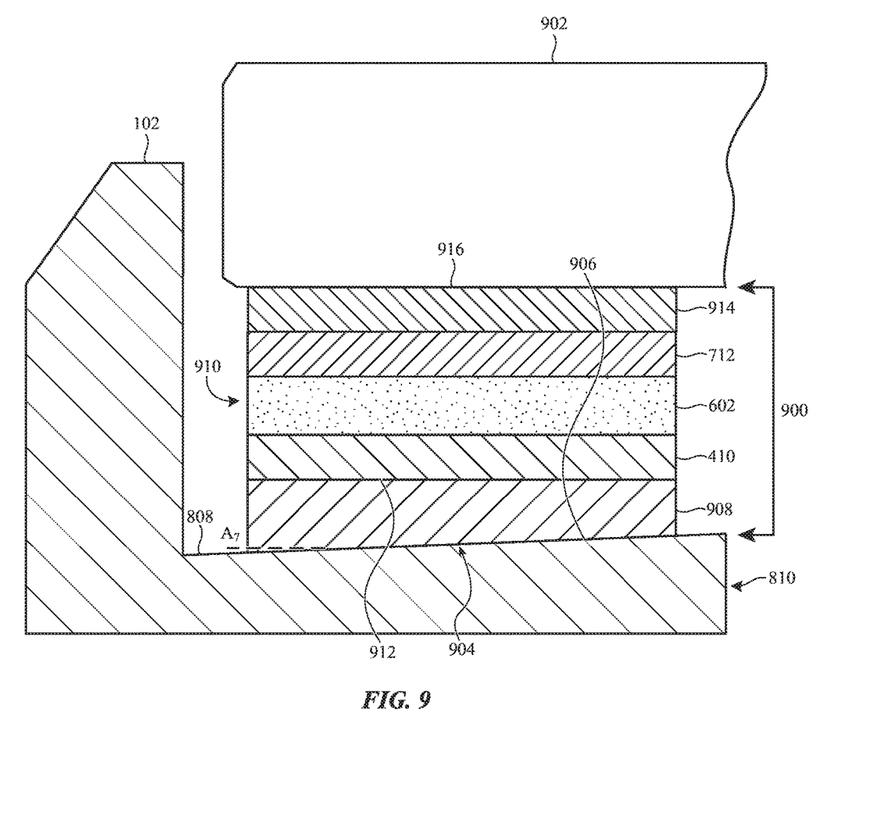

FIG. 9 is another cross-sectional view of the electronic devices 100, 200, and 300 taken along line A-A in FIGS. 1-3. A sixth self-sealing sensor 900 fills the space between the enclosure 102 and a cover glass 902. As shown, the ledge 810 is a tapered ledge and a single tapered interface 904 is formed between the tapered top surface 808 of the ledge 810 and a tapered bottom surface 906 of the first adhesive layer 908. The top surface 808 is tapered at an angle $A_7$. In some embodiments, the taper angle $A_7$ is a function of the ratio of the surface area of the exposed cover glass 902 and the surface area of the exposed side 910 of the sensor 900.

The top surface 912 of the first adhesive layer 908 is substantially flat or horizontal. The first flexible circuit layer 410, the compliant layer 602, the second flexible circuit layer 712, and the second adhesive layer 914 are substantially flat. The bottom surface 916 of the cover glass 902 is substantially flat.

Like the embodiment shown in FIG. 4, each sensor in FIGS. 5-9 includes a tapered profile. The tapered profile is based on a first surface that has a first dimension D1 and a second surface that has a second dimension D2 that is less than D1. In the illustrated embodiments, the first surface is one of the side surfaces of the sensor and the second surface is another side surface of the sensor.

Figure 10:
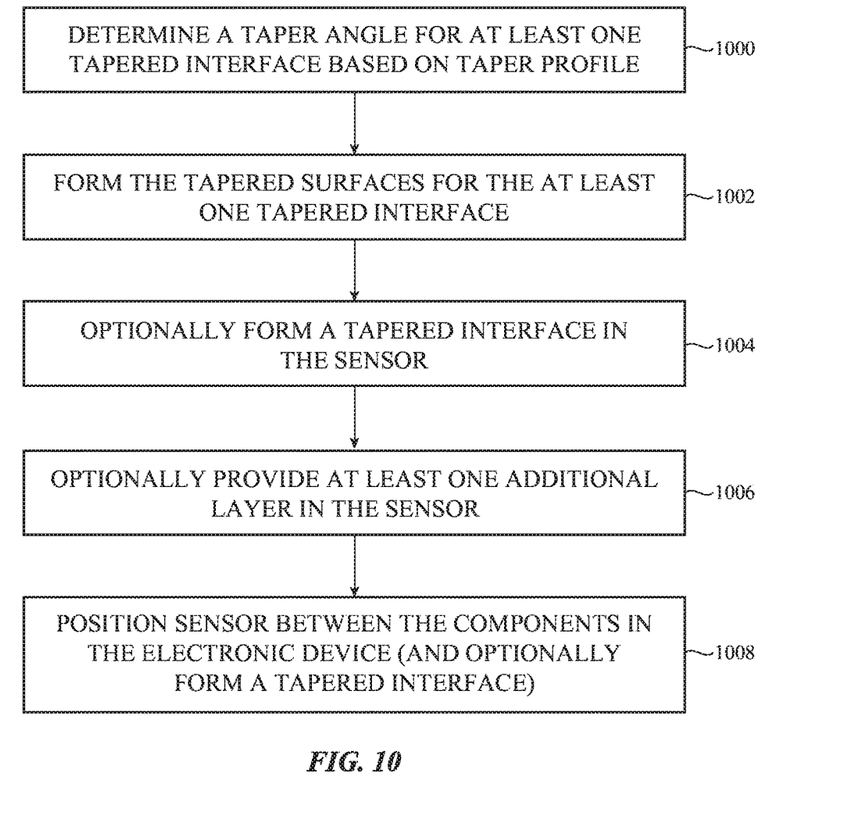
FIG. 10 is a flowchart of a method of producing a self-sealing sensor.

Referring now to FIG. 10, there is shown a flowchart of a method of producing a self-sealing sensor. Initially, a taper angle is determined for at least one interface associated with the sensor (block 1000). The taper angle is based at least in part on a desired or given taper profile for the sensor. As described earlier, the interface can be an interface between two layers in the sensor and/or an interface between a layer in the sensor and at least one component in the electronic device (e.g., the enclosure 102 and/or the cover glass 108). Any suitable method can be used to determine the taper angle. As described earlier, in one embodiment the taper angle is a function of the ratio of the surface area of the exposed cover glass and the surface area of the exposed side of the sensor.

Next, as shown in block 1002, the tapered surfaces for the one or more tapered interfaces are formed. A tapered surface can be formed in one or more surface of a layer and/or in a surface of at least one component. The tapered surface(s) can be formed using any suitable technique, and the method used is based at least in part on the materials in the layer(s) and/or the components. For example, if a tapered surface is to be formed in the cover glass, the respective surface of the cover glass can be etched (e.g., chemically or laser) or molded to produce the tapered surface. Additionally or alternatively, the tapered compliant layer may be created by injection molding the material between the first and second adhesive layers in a tapered mold cavity. As another example, the tapered compliant layer can be formed by stamping the tapered shape into the roll-to-roll sheets (e.g., silicone sheets) prior to curing.

As another example, if the tapered surface is to be formed in a flexible circuit layer, the respective surface of the flexible circuit layer may be etched, cut, or fabricated to form the tapered surface. Additionally or alternatively, the final thickness of the flexible circuit layer can be controlled when the flexible circuit layer is manufactured. Controlling the final thickness can be accomplished using one of a variety of techniques. Shaped spacers can be added to the flexible circuit layer, or the shape of the flexible circuit layer may be "molded" by controlling the squeeze out of the layer-to-layer adhesives.

In those embodiments where a tapered interface is formed within the sensor, the tapered interface or interfaces can then be formed at block 1004. For example, a tapered interface can exist between a compliant layer and a flexible circuit layer (see e.g., FIG. 4) and/or a tapered interface may be formed between a flexible circuit layer and an adhesive layer (see e.g., FIG. 5).

In some embodiments, in addition to the two layers in the sensor that form the tapered interface, the sensor can include one or more additional layers. As one example, in FIG. 4, a tapered interface exists between the compliant layer 416 and the second flexible circuit layer 414. But the sensor 400 also includes the first and second adhesive layers 418, 420 and the first flexible circuit layer 410. In such embodiments, the one or more additional layers are formed in the sensor at block 1006. This block may be omitted in other embodiments.

The sensor can then be positioned between two or more components in the electronic device. For example, as described earlier, the sensor is positioned between a cover glass and an enclosure of the electronic device in one embodiment. Other embodiments can dispose the sensor between different components in an electronic device.

In those embodiments where a tapered interface is formed between the sensor and at least one component, the tapered interface or interfaces are formed at block 1008. For example, a tapered interface can be formed between an adhesive layer and a cover glass (see e.g., FIG. 4). Additionally or alternatively, a tapered interface may be formed between an adhesive layer and an enclosure (see e.g., FIGS. 8 and 9).

Various embodiments have been described in detail with particular reference to certain features thereof, but it will be understood that variations and modifications can be effected within the spirit and scope of the disclosure. And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. A sensor disposed between a first component and a second component of an electronic device, wherein the sensor comprises:
   a first flexible circuit layer;
   a second flexible circuit layer; and
   a compliant layer positioned between the first and second flexible circuit layers; wherein:
      the first flexible circuit layer, the second flexible circuit layer, and the compliant layer form a thickness of the sensor; and
      the thickness of the sensor varies from a first value to a second value such that the sensor has a tapered profile.

2. The sensor as in claim 1, wherein at least one of the first flexible circuit layer, the second flexible circuit layer, or the compliant layer is a tapered layer.

3. The sensor as in claim 1, wherein the sensor further comprises:
   a first adhesive layer positioned between the first component and the first flexible circuit layer;
   a second adhesive layer positioned between the second component and the second flexible circuit layer;
   wherein at least one layer in the sensor is a tapered layer.

4. The sensor of claim 3, wherein the first adhesive layer is the tapered layer and a first end of the first adhesive layer adjacent a gap between the sensor and the second component is thicker than a second end of the first adhesive layer.

5. The sensor of claim 3, wherein the second adhesive layer is the tapered layer and a first end of the second adhesive layer adjacent a gap between the sensor and the second component is thicker than a second end of the second adhesive layer.

6. The sensor of claim 3, wherein the second flexible circuit layer is the tapered layer and a first end of the second flexible circuit layer adjacent a gap between the sensor and the second component is thicker than a second end of the second flexible circuit layer.

7. The sensor of claim 3, wherein a taper angle of the tapered layer is included in a range of one to five degrees.

8. The sensor of claim 3, wherein a taper angle of the tapered layer is included in a range of two to four degrees.

9. The sensor of claim 3, wherein a tapered interface in the sensor has a length of one hundred and fifty microns or less.

10. The sensor of claim 3, wherein a tapered interface in the sensor has a length ranging from twenty-five to seventy-five microns.

11. The sensor of claim 3, wherein the electronic device comprises one of a wearable communication device, a tablet computing device, and a cellular telephone.

12. The sensor of claim 3, wherein the first flexible circuit layer is the tapered layer and a first end of the first flexible circuit layer adjacent a gap between the sensor and the second component is thicker than a second end of the first flexible circuit layer.

13. The sensor of claim 1, wherein the first flexible circuit layer is tapered and a first end of the first flexible circuit layer adjacent a gap between the sensor and the second component is thicker than a second end of the first flexible circuit layer.

14. The sensor of claim 1, wherein the compliant layer is tapered and a first end of the compliant layer adjacent a gap between the sensor and the second component is thicker than a second end of the compliant layer.

15. The sensor of claim 1, further comprising a first set of conductive plates in the first flexible circuit layer and a second set of conductive plates in the second flexible circuit layer, wherein each plate in the first set is paired with a respective plate in the second set to form capacitors.

16. The sensor of claim 15, wherein the sensor comprises a capacitive force sensor.

17. The sensor as in claim 1, wherein at least one interface between two layers of the sensor is a tapered interface.

18. The sensor of claim 17, wherein a taper angle of at least one tapered interface is included in a range of one to five degrees.

19. The sensor of claim 17, wherein a taper angle of at least one tapered interface is included in a range of two to four degrees.

20. The sensor of claim 17, wherein at least one tapered interface has a length of one hundred and fifty microns or less.

21. The sensor of claim 17, wherein a length of at least one tapered interface is included in a range of twenty-five to seventy-five microns.

22. The sensor of claim 17, wherein the electronic device comprises one of a wearable communication device, a tablet computing device, and a smart telephone.

23. The sensor as in claim 1, wherein at least one interface between the compliant layer and the first and second flexible circuit layers is a tapered interface.

24. The sensor of claim 23, wherein a first tapered interface is between the first flexible circuit layer and the compliant layer, wherein a first end of the compliant layer adjacent a side surface of the second component has a thickness that is greater than a thickness of a second end of the compliant layer.

25. The sensor of claim 24, wherein a second tapered interface is between the second flexible circuit layer and the compliant layer.

26. The sensor of claim 23, wherein the tapered interface is between the first flexible circuit layer and the compliant layer, wherein a first end of the first flexible circuit layer adjacent a side surface of the second component has a thickness that is greater than a thickness of a second end of the first flexible circuit layer.

27. The sensor of claim 23, wherein the tapered interface is between the second flexible circuit layer and the compliant layer, wherein a first end of the second flexible circuit layer adjacent a side surface of the second component has a thickness that is greater than a thickness of a second end of the second flexible circuit layer.

28. The sensor of claim 23, further comprising a first set of conductive plates in the first flexible circuit layer and a second set of conductive plates in the second flexible circuit layer, wherein each plate in the first set is paired with a respective plate in the second set to form capacitors.

29. The sensor of claim 28, wherein the sensor comprises a capacitive force sensor.

30. The sensor of claim 23, wherein a taper angle of at least one tapered interface is a function of a ratio of a surface area of a first exposed surface and a surface area of a second exposed surface.

31. The sensor of claim 1, further comprising:
a first adhesive layer positioned between the first flexible circuit layer and the first component; and
a second adhesive layer positioned between the second flexible circuit layer and a bottom surface of the second component.

32. The sensor of claim 31, wherein an interface between the first adhesive layer and the first component is a tapered interface such that an end of the first component has a thickness that is less than a thickness of a center of the first component.

33. An electronic device, comprising:
an enclosure having an opening;
a cover glass disposed in the opening; and
a force sensor positioned between the cover glass and the enclosure, wherein a bottom surface of the cover glass adjacent a top surface of the force sensor is tapered such that a thickness of the cover glass decreases toward an edge of the cover glass.

34. The electronic device of claim 33, wherein the force sensor comprises:
a first adhesive layer positioned between the enclosure and a first flexible circuit layer;
a second adhesive layer positioned between the bottom surface of the cover glass and a second flexible circuit layer; and
a compliant layer positioned between the first and second flexible circuit layers, wherein the first flexible circuit layer comprises a first set of conductive plates and the second flexible circuit layer comprises a second set of conductive plates and each plate in the first set of conductive plates is paired with a respective plate in the second set of conductive plates to form capacitors.

35. An electronic device, comprising:
an enclosure having an opening and a ledge extending into an interior of the electronic device;
a cover glass disposed in the opening; and
a force sensor positioned between the cover glass and the ledge, wherein a surface of the ledge adjacent a bottom surface of the force sensor is tapered such that a thickness of the ledge increases toward an edge of the ledge in the interior of the electronic device.

36. The electronic device of claim 35, wherein the force sensor comprises:
a first adhesive layer positioned between the ledge and a first flexible circuit layer;
a second adhesive layer positioned between a bottom surface of the cover glass and a second flexible circuit layer; and
a compliant layer positioned between the first and second flexible circuit layers, wherein the first flexible circuit layer comprises a first set of conductive plates and the second flexible circuit layer comprises a second set of conductive plates and each plate in the first set of conductive plates is paired with a respective plate in the second set of conductive plates to form capacitors.

* * * * *